(12) United States Patent
Fukuda

(10) Patent No.: US 8,483,579 B2
(45) Date of Patent: Jul. 9, 2013

(54) PHASE DETECTOR CIRCUIT FOR CLOCK AND DATA RECOVERY CIRCUIT AND OPTICAL COMMUNICATION DEVICE HAVING THE SAME

(75) Inventor: Koji Fukuda, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 620 days.

(21) Appl. No.: 12/538,250

(22) Filed: Aug. 10, 2009

(65) Prior Publication Data
US 2010/0054760 A1 Mar. 4, 2010

(30) Foreign Application Priority Data
Aug. 29, 2008 (JP) ................................. 2008-220787

(51) Int. Cl.
*H04B 10/06* (2006.01)
*H04L 7/04* (2006.01)
*G01R 25/00* (2006.01)
*H03D 13/00* (2006.01)

(52) U.S. Cl.
USPC .............................. 398/202; 375/362; 327/12

(58) Field of Classification Search
USPC ............................. 398/202; 327/12; 375/362
See application file for complete search history.

(56) References Cited

U.S. PATENT DOCUMENTS

| 5,022,057 | A * | 6/1991 | Nishi et al. ..................... 375/373 |
| 2003/0081712 | A1 | 5/2003 | Takada |
| 2003/0167417 | A1 * | 9/2003 | To et al. ......................... 713/500 |
| 2003/0223527 | A1 | 12/2003 | Otomo |
| 2005/0213696 | A1 | 9/2005 | Totsuka et al. |
| 2006/0022724 | A1 * | 2/2006 | Zerbe et al. .................... 327/141 |
| 2006/0146891 | A1 * | 7/2006 | Kunitani et al. ............... 370/518 |
| 2008/0069565 | A1 | 3/2008 | Takahara |
| 2008/0292038 | A1 * | 11/2008 | Ide ................................. 375/355 |
| 2009/0207957 | A1 | 8/2009 | Fukuda et al. |

FOREIGN PATENT DOCUMENTS

| JP | 04-207520 | 7/1992 |
| JP | 2002-094494 | 3/2002 |
| JP | 2003-134096 | 5/2003 |
| JP | 2004-88212 | 3/2004 |
| JP | 2005-210540 | 8/2005 |
| JP | 2007-267005 | 10/2007 |
| JP | 2008-72621 | 3/2008 |
| JP | 2009-200570 | 9/2009 |
| WO | WO2004/098120 | 11/2004 |

OTHER PUBLICATIONS

A. Pottbacker, et al. "A Si Bipolar Phase and Frequency Detector IC for Clock Extraction up to 8Gb/s" (IEEE Journal of Solid-State Circuits, vol. 27, No. 12, pp. 1747-1751, Dec. 1992).
Office Action in JP2008-220787, dated Aug. 21, 2012 (in Japanese) {with English language translation}.
Pottbacker, Ansgar; "A Si Bipolar Phase and Frequency Detector IC for Clock Extraction Up to 8 Gb/s", IEEE Journal of Solid-State Circuits, vol. 27, No. 12, Dec. 1992.

* cited by examiner

*Primary Examiner* — Nathan Curs
(74) *Attorney, Agent, or Firm* — Antonelli, Terry, Stout & Kraus, LLP.

(57) ABSTRACT

A high-accuracy phase detector circuit compatible with a 1/N rate architecture is provided. The phase detector circuit has as many as N track-and-hold circuits for tracking and holding N-phase clock signals CLK_1 to CLK_N in synchronization with a rising edge of input data signal DIN. Out of the N-phase clock signals CLK_1 to CLK_N outputted from as many track-and-hold circuits, only the one whose rising edge is most synchronized with a rising edge of the input data signal DIN is selected and outputted as a phase difference signal.

20 Claims, 13 Drawing Sheets

US 8,483,579 B2

PHASE DETECTOR CIRCUIT FOR CLOCK AND DATA RECOVERY CIRCUIT AND OPTICAL COMMUNICATION DEVICE HAVING THE SAME

CLAIM OF PRIORITY

The present application claims priority from Japanese patent application JP 2008-220787 filed on Aug. 29, 2008, the content of which is hereby incorporated by reference into this application.

FIELD OF THE INVENTION

The present invention relates to a phase detector circuit, particularly, to technology useful for application to a phase detector included in a clock and data recovery (CDR) circuit.

BACKGROUND OF THE INVENTION

In recent years, the bandwidth required for inter-chip data transmission has been rapidly expanding. To cope with the situation, serial transmission systems which are not affected by skews between signal lines have come to be widely used instead of parallel transmission systems which have been in use to transmit plural pieces of data and clock signals concurrently. In a serial transmission system, data with embedded clock signals is transmitted via a single signal line to be recovered into the data and clock signals by a CDR circuit on a receiving side.

FIG. 10 schematically shows the configuration of a CDR circuit 1000 including a track-and-hold type phase detector as disclosed in reference literature: A. Pottbacker, et al. "A Si Bipolar Phase and Frequency Detector IC for Clock Extraction up to 8 Gb/s" (IEEE Journal of Solid-State Circuits, Vol. 27, No. 12, pp 1747-1751, 1992). A symbol determination unit 1001 determines the symbol of an input data signal DIN 102 in synchronization with a recovered clock signal CLK 103 recovered by a voltage-controlled oscillator (VCO) 1005 and outputs recovered data DOUT 1002. A phase detector circuit 101 compares the phases of the recovered clock signal CLK and the input data signal DIN, and outputs a phase difference signal 104 representing the phase difference between them. A low-pass filter 1003 temporally averages the phase difference signal 104 and outputs an oscillation frequency control voltage 1004 to the VCO. Namely, when the recovered clock signal CLK is, on the average, behind the input data signal DIN in phase, the oscillation frequency of the VCO is increased; and, when the recovered clock signal CLK is, on the average, ahead of the input data signal DIN in phase, the oscillation frequency of the VCO is decreased. This aligns the recovered clock signal CLK and the input data signal DIN in phase allowing the symbol determination unit 1001 to correctly determine the symbol of the input data signal DIN.

FIG. 11A schematically shows an example configuration of a principal portion of the track-and-hold type phase detector circuit 101 shown in FIG. 10. FIG. 11B is a timing chart of an example operation of the track-and-hold type phase detector circuit. Referring to FIG. 11A, the track-and-hold type phase detector circuit 101 includes a track-and-hold circuit 1101. The track-and-hold circuit 1101 tracks and holds the recovered clock signal CLK in synchronization with a rising edge of the input data signal DIN, and outputs it as a phase difference signal. The recovered clock signal CLK is, as shown in FIG. 11B, formed of a voltage waveform with limited rising/falling time. Therefore, tracking and holding the recovered clock signal CLK in synchronization with a rising edge of the input data signal DIN causes the phase difference between the input data signal DIN and the recovered clock signal CLK to be converted into voltage and then outputted. Even though, in the configuration of the track-and-hold circuit shown in FIG. 11A, the track-and-hold circuit operates only in synchronization with a rising edge of the input data signal DIN, there are many cases where an additional track-and-hold circuit which operates in synchronization with a falling edge of the input data signal DIN is also used so as to perform phase comparison between the input data signal DIN and the recovered clock signal CLK at both rising and falling edges of the input data signal DIN.

A CDR circuit can be formed in a half-rate architecture or a 1/N rate architecture. In a half-rate architecture, the clock signal CLK has a frequency equaling one half of a symbol rate and the input data signal DIN is checked in synchronization with a rising edge and also in synchronization with a falling edge of the clock signal CLK. In a 1/N rate architecture, N-phase clock signals are used with each clock signal having a frequency equaling 1/N times a symbol rate. FIG. 12 is a timing chart of operation in a half-rate architecture of the track-and-hold type phase detector circuit, shown in FIGS. 11A and 11B, disclosed in the above reference literature. Since the clock signal CLK has a frequency equaling one half of the symbol rate of the input data signal DIN, the output voltage is either high or low depending on with which one of a rising edge and a falling edge of the clock signal CLK a rising edge of the input data signal DIN is synchronized. Namely, when the track-and-hold type phase detector circuit disclosed in the above reference literature and described above with reference to FIGS. 11A and 11B is used in a half-rate architecture, it may output two, i.e. high and low, phase difference signals even with the phase difference between the input data signal DIN and the clock signal CLK unchanged. This makes the phase detector circuit useless.

FIG. 13 is a block diagram of an example configuration of the track-and-hold type phase detector circuit, which is compatible with a half-rate architecture, disclosed in JP-A No. 2007-267005 to cope with the above problem. The track-and-hold type phase detector circuit shown in FIG. 13 includes, in addition to a track-and-hold circuit 1101, a determination circuit 1301 and a polarity inversion circuit 1302. The determination circuit 1301 determines with which of a rising edge and a falling edge of the clock signal CLK a rising edge of the input data signal DIN is synchronized. When the rising edge of the input data signal DIN is synchronized with a rising edge of the clock signal CLK, the polarity inversion circuit 1302 outputs the signal received from the track-and-hold circuit 1101 as it is as a phase difference signal 104. When the rising edge of the input data signal DIN is synchronized with a falling edge of the clock signal CLK, the polarity inversion circuit 1302 outputs the signal received from the track-and-hold circuit 1101 as a phase difference signal 104 after inverting its polarity. This allows the phase detector circuit 101 in a half-rate architecture to output a correct phase difference signal regardless of whether the rising edge of the input data signal DIN is synchronized with a rising edge or a falling edge of the clock signal CLK.

The track-and-hold type phase detector circuit compatible with a half-rate architecture disclosed in JP-A No. 2007-267005 and shown in FIG. 13 may be used in a CDR circuit included in a serializer/deserializer which performs, in a data communication device, conversion between a relatively low-speed, higher-layer digital signal and a high-speed serial signal (analog waveform).

SUMMARY OF THE INVENTION

The track-and-hold type phase detector circuit compatible with a half-rate architecture disclosed in JP-A No. 2007-267005 requires the polarity of voltage, i.e. an analog value, outputted from the track-and-hold circuit 1101 to be inverted by the polarity inversion circuit 1302.

It is, however, difficult to invert the polarity of an analog voltage value with high accuracy. The phase difference signal 104 outputted from the phase detector circuit may therefore include errors caused by polarity inversion performed at the polarity inversion circuit. To cope with such a problem, applying a differential configuration to every signal and circuit involved and realizing signal polarity inversion by switching circuit connections may be considered. A differential configuration, however, enlarges the circuit size and increases the power consumption by the circuit.

The track-and-hold type phase detector circuit compatible with a half-rate architecture disclosed in JP-A No. 2007-267005 and shown in FIG. 13 is based on the assumption that a rising edge of the input data signal DIN is synchronized with either a rising edge or a falling edge of the clock signal CLK. When a 1/N rate architecture in which the clock signal CLK has a frequency equaling 1/N times a symbol rate is used, however, it can occur that a rising edge of the input data signal DIN is synchronized with neither a rising edge nor a falling edge of a clock signal. Thus, the track-and-hold type phase detector circuit compatible with a half-rate architecture disclosed in JP-A No. 2007-267005 and shown in FIG. 13 cannot be used in a 1/N rate architecture.

As described above, for an existing track-and-hold type phase detector circuit compatible with a half-rate architecture, it is difficult to realize a polarity inversion circuit which is high in accuracy and low in power consumption. Besides such a track-and-hold type phase detector circuit compatible with a half-rate architecture is not compatible with a 1/N rate architecture.

The track-and-hold type phase detector circuit compatible with a half-rate architecture disclosed in JP-A No. 2007-267005 and shown in FIG. 13 is assumed to be used in a CDR circuit included in a serializer/deserializer which performs, in a communication device, conversion between a relatively low-speed, higher-layer digital signal and a high-speed serial signal (analog waveform). In cases where the CDR circuit is of a 1/N rate architecture in which N-phase clock signals each with a period equaling N times a symbol time are used, a circuit block for processing analog voltage as it is as analog data, for example, for polarity inversion is required. This makes it difficult to produce a low-power-consuming communication device at a low cost. The present invention has been made to address the above problem, and it is an object of the invention to provide a track-and-hold type phase detector circuit compatible with a half-rate or a 1/N rate architecture which can operate with high accuracy and low power consumption. Another object of the invention is to realize low-cost production of a low-power-consuming communication device including a serializer/deserializer in which a CDR circuit having a track-and-hold type phase detector circuit compatible with a half-rate or a 1/N rate architecture is used. The above and other objects and novel features of the invention will become apparent from the following detailed description of the invention when considered in conjunction with the accompanying drawings.

According to one aspect of the present invention, there is provided a phase detector circuit for outputting a phase difference between one of an input signal and an inversion of the input signal and one of a plurality of clock signals. In the phase detector circuit, the plurality of clock signals total N in number, N being an integer of 2 or larger, and the clock signals each have a period equaling N times a period of one of the input signal and the inversion of the input signal with their phases shifted in steps of 1/N times the period. The phase detector circuit comprises: a phase detecting unit which outputs phase difference signals representing phase differences between a rising edge of one of the input signal and the inversion of the input signal and the clock signals totaling N; an identification signal output unit which outputs an identification signal identifying one of a first clock signal and a second clock signal, the first clock signal being one among the clock signals totaling N whose phase relative to a rising edge of one of the input signal and the inversion of the input signal is closest to 0 or an even number multiple of $\pi$, the second clock signal being one among the clock signals totaling N whose phase relative to a rising edge of one of the input signal and the inversion of the input signal is closest to an odd number multiple of $\pi$; and a signal selection unit which selects, out of the phase difference signals outputted by the phase detecting unit, one representing the phase difference between a rising edge of one of the input signal and the inversion of the input signal and one of the first clock signal and the second clock signal according to the identification signal.

According to another aspect of the present invention, there is provided an optical communication device having a first conversion circuit for converting an optical input signal received from an optical network into an electrical signal, a second conversion circuit for processing the electrical signal outputted from the first conversion circuit for analog-to-digital conversion to obtain a digital signal, and a logic circuit for logically processing the digital signal outputted from the second conversion circuit. In the optical communication device, the second conversion circuit comprises: a phase detecting unit which outputs phase differences between a rising edge of one of the electrical signal and an inversion of the electrical signal and a plurality of clock signals totaling N in number, N being an integer of 2 or larger, the clock signals each having a period equaling N times a period of one of the electrical signal and the inversion of the electrical signal and having phases shifted in steps of 1/N times the period; an identification signal output unit which outputs an identification signal identifying one of a first clock signal and a second clock signal, the first clock signal being one among the clock signals totaling N whose phase relative to a rising edge of one of the electrical signal and the inversion of the electrical signal is closest to 0 or an even number multiple of $\pi$, the second clock signal being one among the clock signals totaling N whose phase relative to a rising edge of one of the electrical signal and the inversion of the electrical signal is closest to an odd number multiple of $\pi$; and a signal selection unit which selects and outputs, according to the identification signal, one, out of the phase difference signals outputted by the phase detecting unit, representing the phase difference between a rising edge of one of the electrical signal and the inversion of the electrical signal and one of the first clock signal and the second clock signal.

The present invention makes it possible, as a typical advantageous effect thereof, to realize a small-sized, low-power-consuming, high-accuracy, track-and-hold type phase detector circuit compatible with a 1/N rate architecture. As another typical advantageous effect of the invention, a communication device including a serializer/deserializer in which a CDR circuit having a track-and-hold type phase detector circuit according to the invention is used and in which N-phase clock signals each having a period equaling N times a symbol time are used can be made producible at a low cost compared with an existing type of a communication device, and the communication device can be also made low-power-consuming.

DETAILED DESCRIPTION OF THE PREFERRED EMBODIMENTS

Figure 1:
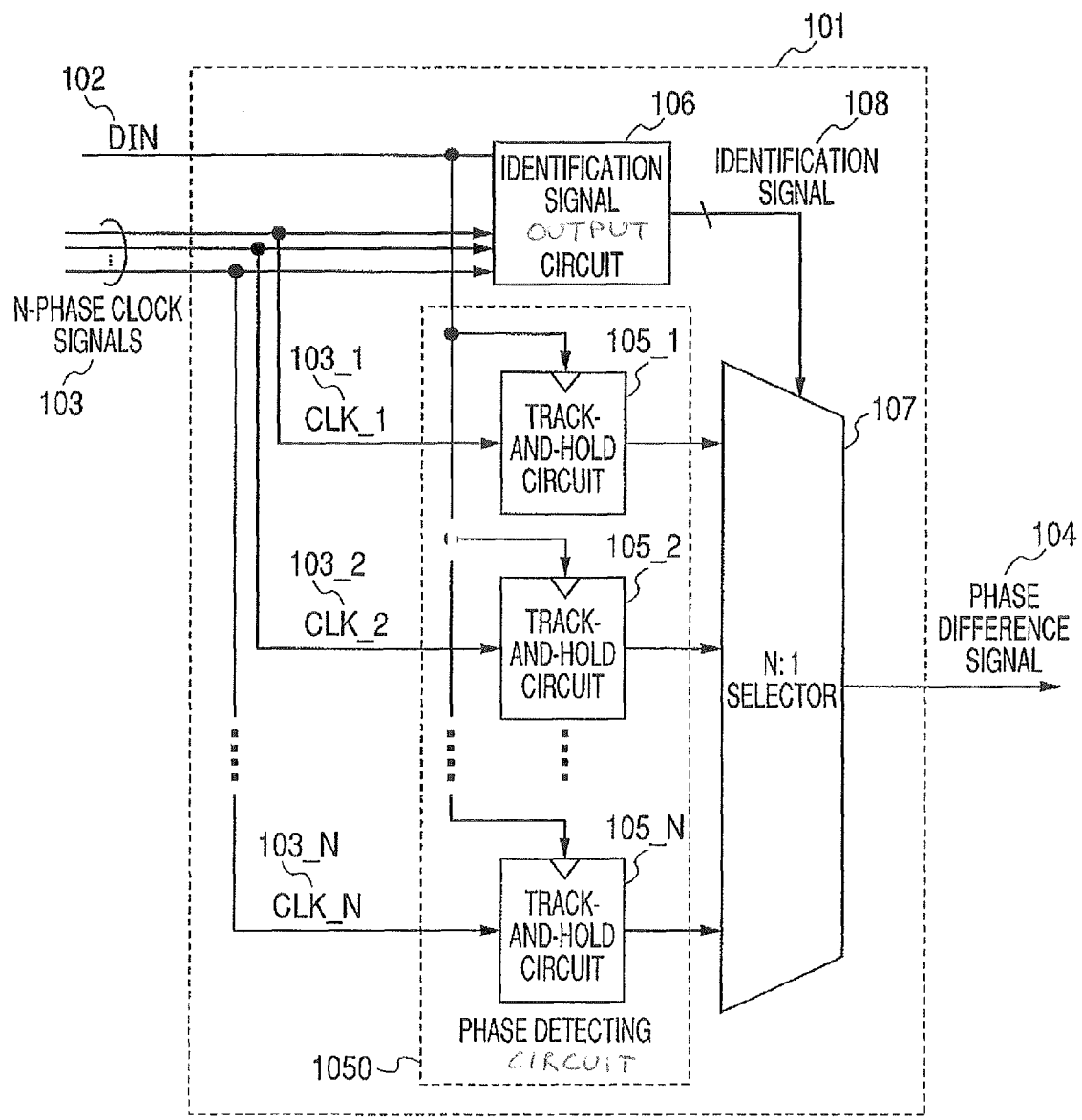
FIG. 1 is a block diagram of an example configuration of a phase detector circuit for a clock and data recovery circuit according to a first embodiment of the present invention.

In the following, the description of the present invention will be divided into two or more sections or will range over two or more embodiments as required for the sake of convenience. Unless otherwise expressed, such sections and embodiments are not mutually irrelevant. For example, among such sections and embodiments, one is a partial or total modification of another, or one elaborates or supplements another. Also, numbers referred to in the following description of embodiments (for example, numbers representing counts, amounts, ranges, or other numeric values) are not defined ones, that is, they may be smaller or larger unless otherwise expressed or except when they are apparently defined in principle.

Furthermore, the constituent elements (including element steps) of the following embodiments are not necessarily indispensable unless otherwise expressed or except when they are apparently indispensable in principle. Similarly, the shapes of constituent elements and positional relationships between them referred to in the following description are inclusive of those substantially close to or similar to them unless otherwise expressed or except when they are apparently considered strictly defined in principle. This also applies to the numeric values and ranges.

Embodiments of the present invention will be described in detail below with reference to drawings. Note that, in the drawings referred to in describing the following embodiments, identical members are denoted, as a rule, by identical reference symbols, and duplicate descriptions of identical members are omitted.

First Embodiment

FIG. 1 is a block diagram of an example configuration of a phase detector circuit for a clock and data recovery circuit according to a first embodiment of the present invention. Referring to FIG. 1, a phase detector circuit 101 includes a phase detecting section 1050 having as many as N track-and-hold circuits 105_1 to 105_N (wherein N represents an integer of 2 or larger), an identification signal generation circuit 106, and an N:1 selector 107 used as a signal selection unit to select one out of as many as N signals. The track-and-hold circuits 105_1 to 105_N track, hold, and output, at a rising edge of an input data signal DIN (hereinafter also referred to simply as the "DIN"), N-phase clock signals 103 (i.e. 103_1 (CLK_1) to 103_N (CLK_N)) with phases shifted in $2\pi/N$ steps. The identification signal generation circuit 106 operating every time the DIN rises from low (L) to high (H) determines which one of the N-phase clock signals (CLK_1 to CLK_N) is closest in phase to 0 or an even-number multiple of $\pi$ relative to the rising edge of the DIN and outputs an identification signal 108 identifying the clock signal thus determined. The N:1 selector 107 selects, out of the clock signals outputted from the track-and-hold circuits 105_1 to 105_N, the one identified by the identification signal 108, and outputs the selected signal as a phase difference signal 104.

Thus, every time the DIN rises from low to high, the clock signal whose phase relative to a rising edge of the DIN is closest to 0 or an even-number multiple of $\pi$ is captured, held, and outputted.

Even though, in the present embodiment described above, every time the DIN rises from low to high, one out of the clock signals CLK_1 to CLK_N whose phase relative to the rising edge of the DIN is closest to 0 or an even-number multiple of $\pi$ is sampled and held for use in phase comparison, a different configuration may also be used in which, every time the DIN rises from low to high, one out of the clock signals CLK_1 to CLK_N whose phase relative to the rising edge of the DIN is closest to an odd-number multiple of $\pi$ is sampled and held. The conversion gain generated in converting a phase difference to an output voltage in the phase detector circuit can be adjusted by adjusting the rise time or full-amplitude voltage of each of the N-phase clock signals CLK_1 to CLK_N. Furthermore, adjusting the output voltage transition (transient waveform) taking place when each of the N-phase clock signals CLK_1 to CLK_N rises makes it possible to adjust the relationship between the phase difference and output voltage determined in the phase detector circuit into a desired linear or nonlinear characteristic.

In the phase detector circuit configured as described above, the phase difference signal represents the phase difference between a rising edge of the input data signal DIN and either a rising edge or a falling edge of one of the clock signals CLK, so that the possibility of outputting two kinds of (high and low) phase difference signals is eliminated.

Figure 2:
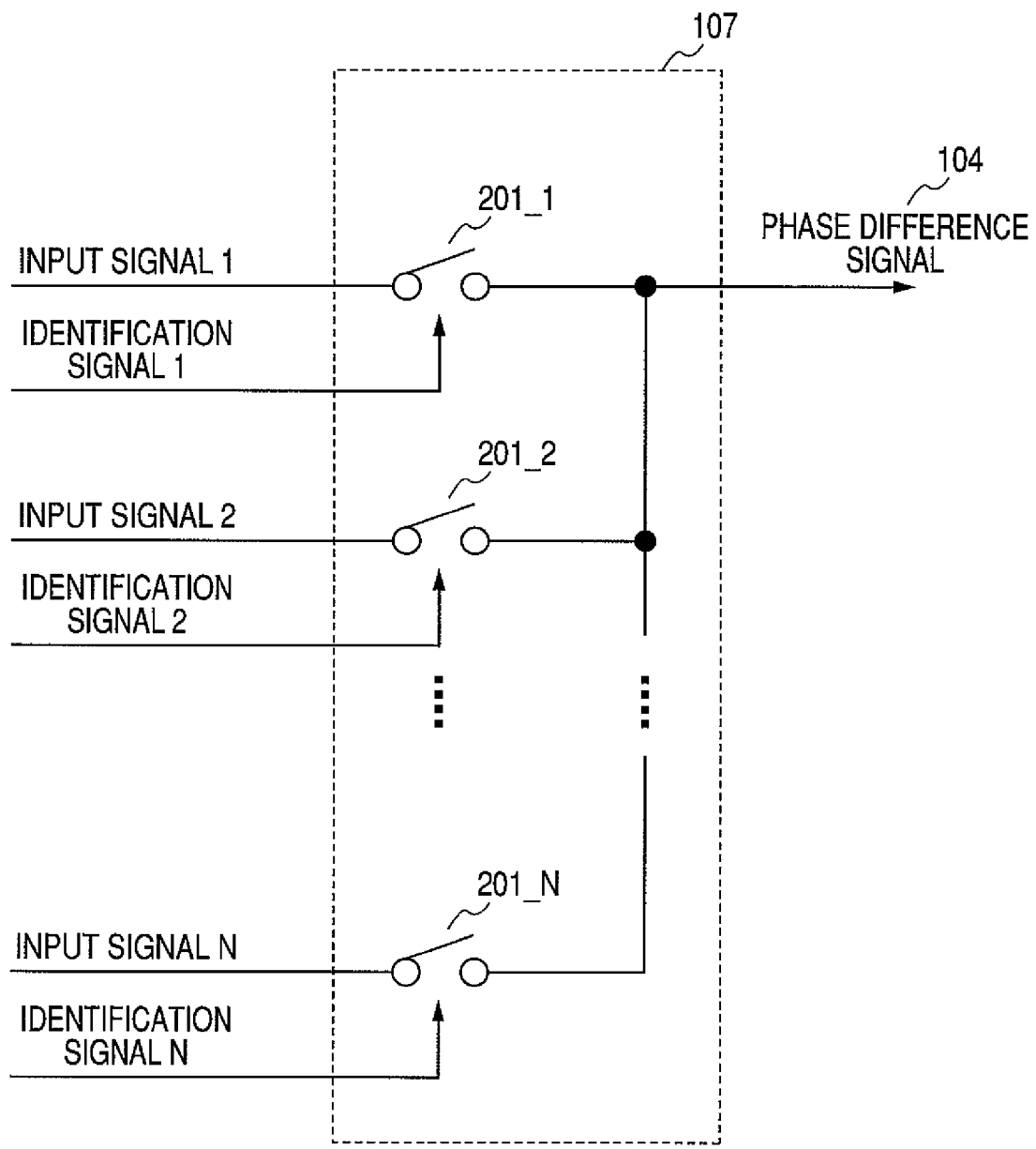
FIG. 2 is a detailed block diagram of an example configuration of the N:1 selector shown in FIG. 1.

FIG. 2 is a block diagram of an example configuration of the N:1 selector 107. The N:1 selector 107 shown in FIG. 2 includes as many as N switches 201_1 to 201_N which close and open to selectively output input signals 1 to N as the phase difference signal 104 according to identification signals 1 to N. In the present embodiment, the identification signals 1 to N cause only one of the switches 201_1 to 201_N to close. Namely, out of the identification signals 1 to N, only the one identifying the one among the N-phase clock signals 103 (CLK_1 to CLK_N) whose phase relative to a rising edge of the DIN is closest to 0 or an even-number multiple of π causes the corresponding one of the switches 201_1 to 201_N to close, whereas the other switches totaling (N−1) are left open. An alternative configuration may be adopted in which more than or fewer than N identification signals 108 are inputted from the identification signal generation circuit 106 to the N:1 selector 107 and in which as many as N identification signals are determined by logic operation.

Figure 3:
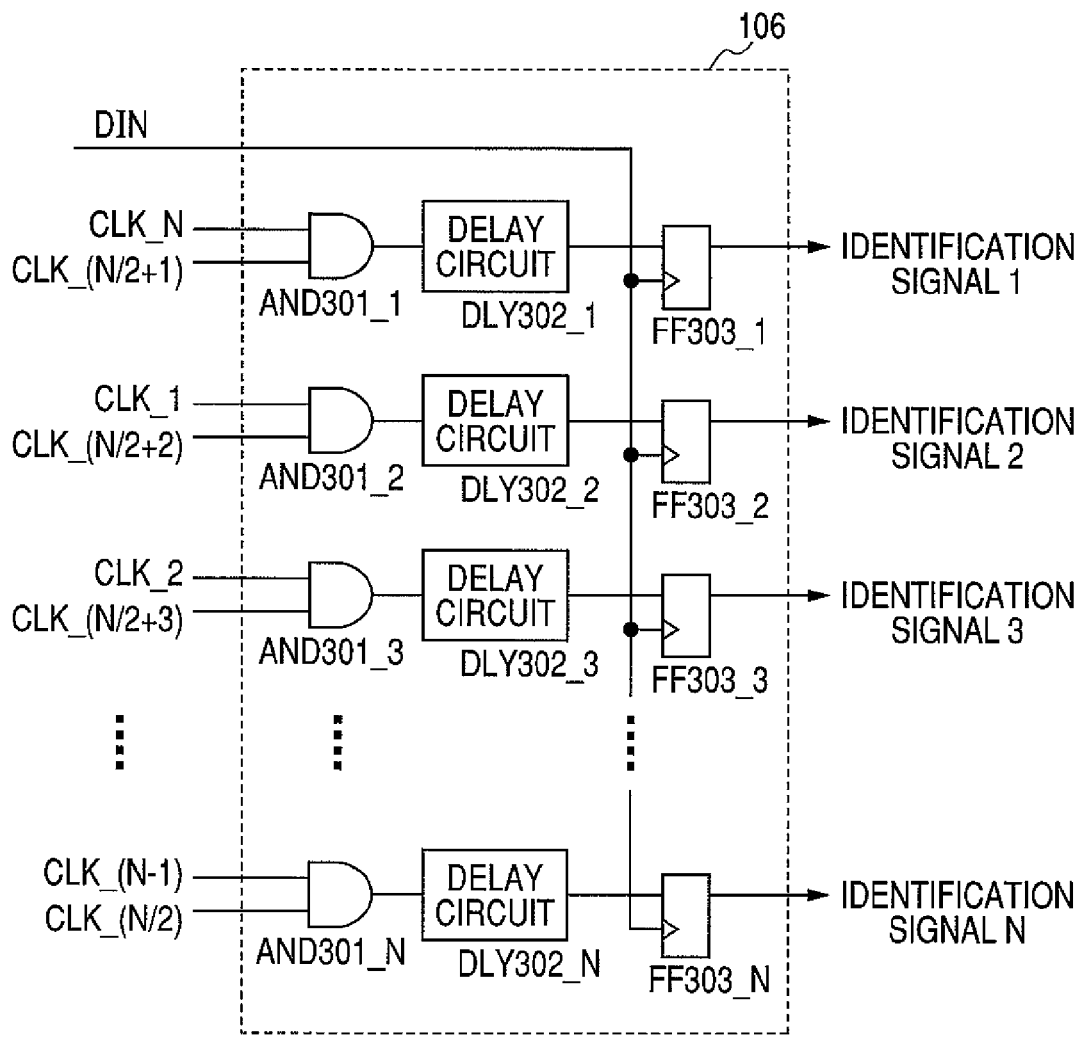
FIG. 3 is a detailed block diagram of an example configuration of the identification signal generation circuit shown in FIG. 1.

FIG. 3 is a block diagram of an example configuration of the identification signal generation circuit 106. Referring to FIG. 3, the N-phase clock signals CLK_1 to CLK_N are clock signals with a duty ratio of 50% whose phases are shifted in 2π/N steps, N representing an even integer. Using as many as N AND circuits AND301_1 to AND301_N, as many logical products of clock signals are obtained, each logical product being of one of the N-phase clock signals and the (N/2−1)th clock signal counted from the one. The logical products thus obtained are delayed using as many delay circuits and are then latched by as many flip-flops FF303_1 to FF303_N each synchronized with a rising edge of the DIN, thereby generating as many as N identification signals. The purpose of obtaining such logical products of N-phase clock signals is to generate, from the N-phase clock signals 103 with a duty ratio of 50%, N-phase asymmetric clock signals with phases shifted in 2π/N steps and each with a high period equaling a symbol time and a low period equaling (N−1) times the symbol time.

The delay time of each of the delay circuits DLY 302_1 to DLY 302_N is shorter than a symbol time. It is typically one half of a symbol time. For each of as many as N identification signals 108 (1 to N) corresponding to the N-phase clock signals CLK_1 to CLK_N, an asymmetric clock signal preceding the corresponding clock signal by one phase (a symbol time) is delayed by a half symbol time and then latched by a flip-flop synchronized with a rising edge of the DIN. In this way, out of as many as N identification signals 108 (1 to N), only the one corresponding to the one out of the N-phase clock signals 103 (CLK_1 to CLK_N) whose phase relative to a rising edge of the DIN is closest to 0 or an even-number multiple of π is selected.

Depending on the combination of the delay time of each of the AND circuits AND301_1 to AND301_N and the setup time required for each of the flip-flops FF303_1 to FF303_N, it is possible to use a different circuit configuration including no delay circuit.

Figure 4:
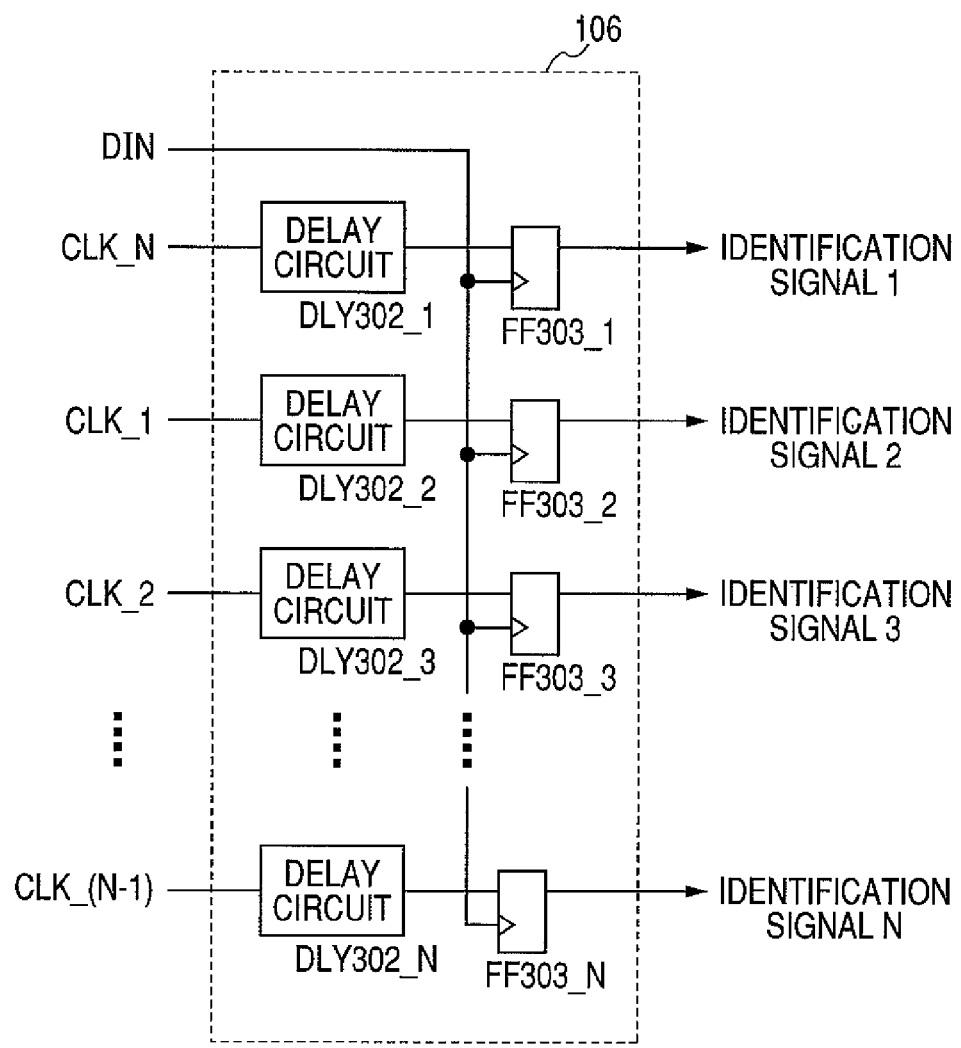
FIG. 4 is a detailed block diagram of another example configuration of the identification signal generation circuit shown in FIG. 1.

FIG. 4 is a block diagram of another example configuration of the identification signal generation circuit 106. The N-phase clock signals CLK_1 to CLK_N are delayed by as many corresponding delay circuits, and are then latched by as many flip-flops FF303_1 to FF303_N each synchronized with a rising edge of the DIN so as to generate as many as N identification signals. The delay time of each of the delay circuits DLY302_1 to DLY302_N is shorter than one symbol time. It is typically one half of a symbol time. Depending on the combination of the delay time of each of the AND circuits AND301_1 to AND301_N and the setup time required for each of the flip-flops FF303_1 to FF303_N, it is possible to use a different circuit configuration including no delay circuit. Referring to FIG. 4, the N-phase clock signals CLK_1 to CLK_N are asymmetric clock signals with phases shifted in 2π/N steps and each with a high period equaling a symbol time and a low period equaling (N−1) times the symbol time. Referring to FIG. 1, the track-and-hold circuits only hold the voltages of the N-phase clock signals CLK_1 to CLK_N sampled at a rising edge of the input data signal DIN, so that they can properly operate even in cases where the N-phase clock signals CLK_1 to CLK_N are asymmetric clock signals with phases shifted in 2π/N steps and each with a high period equaling a symbol time and a low period equaling (N−1) times the symbol time. In this case, since the identification signal generation circuit 106 is designed to use, as the N-phase clock signals CLK_1 to CLK_N, asymmetric clock signals with phases shifted in 2π/N steps and each with a high period equaling a symbol time and a low period equaling (N−1) times the symbol time, the AND circuits included in the circuit configuration shown in FIG. 3 are not required. Therefore, a simpler circuit configuration can be used, and the number represented by "N" of phases of the clock signals can be odd.

Another circuit configuration may also be used which includes, instead of the flip-flops FF303_1 to FF303_N shown in FIGS. 3 and 4, level sensing latches to operate in through mode when the DIN is low and in hold mode when the DIN is high. Such a circuit configuration including level sensing latches can be made simpler than those including flip-flops and, in addition, the delay of identification signals relative to the DIN is reduced. This makes timing adjustment easier between outputting of the phase difference signals 104 from the track-and-hold circuits 105_1 to 105_N and the operations of the switches 201_1 to 201_N.

Figure 5:
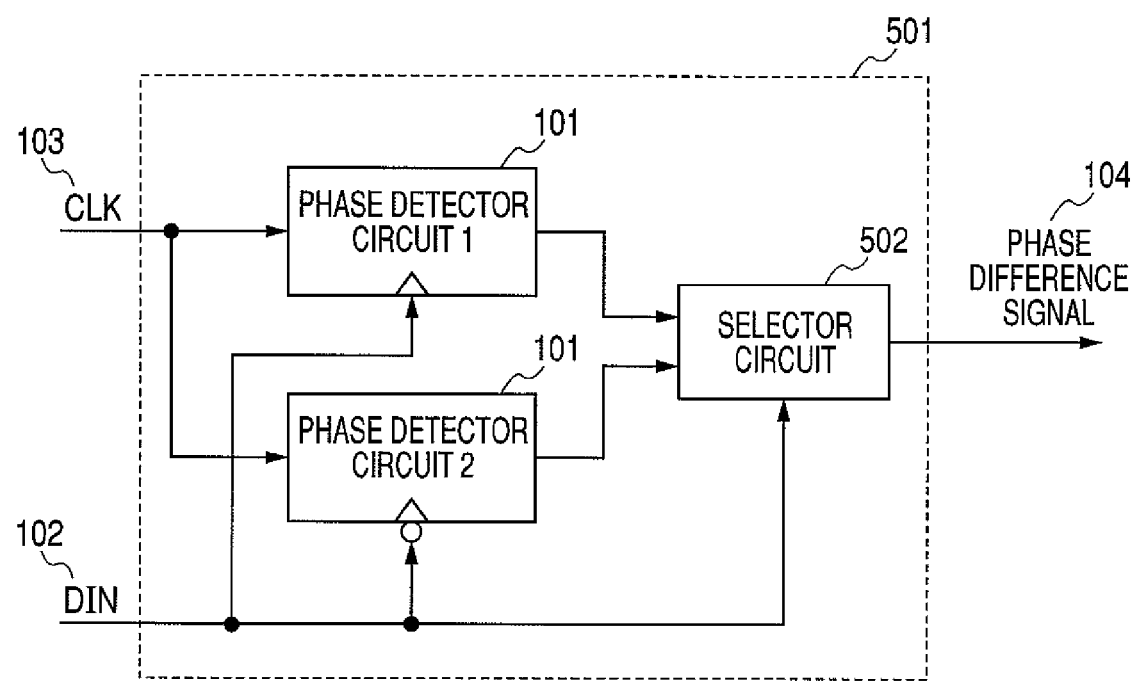
FIG. 5 is a block diagram of an example configuration of a phase detector circuit for a clock and data recovery circuit which includes two phase detector circuits to perform phase comparison at both rising and falling edges of an input data signal.

The phase detector circuit shown in FIG. 1 is configured to perform phase comparison only at a rising edge of the DIN. FIG. 5 is a block diagram of an example configuration of a phase detector circuit which performs phase comparison at both rising and falling edges of the DIN. A phase comparison circuit 501 shown in FIG. 5 includes two phase detector circuits 101, shown in FIG. 1, and a selector circuit 502. One of the two phase detector circuits 101 is for performing phase comparison at a rising edge of the DIN. The other of the two phase detector circuits 101 is for performing phase comparison at a falling edge of the DIN. The phase detector circuit for performing phase comparison at a falling edge of the DIN can be realized easily, for example, by inverting the data signal DIN inputted to the phase detector circuit for performing phase comparison at a rising edge of the DIN. The selector circuit 502 selectively outputs the signal inputted from either of the two phase detector circuits 101 as a phase difference signal 104. Namely, when the DIN is high, the selector circuit 502 outputs the signal inputted from the phase detector circuit for performing phase comparison at a rising edge of the DIN; and, when the DIN is low, the selector circuit 502 outputs the signal inputted from the phase detector circuit for performing phase comparison at a falling edge of the DIN. The two phase detector circuits 101 may each have a different configuration, being described later, than the one shown in FIG. 1.

As described above, the phase detector circuit for a clock and data recovery circuit of the first embodiment makes it possible, in a 1/N rate architecture in which N-phase clock signals each with a period equaling N times a symbol time are used, to accurately output the phase difference between the data signal DIN and a clock signal using a simple circuit without requiring a circuit block for processing analog voltage as it is as analog data, for example, for polarity inversion.

Second Embodiment

Figure 6:
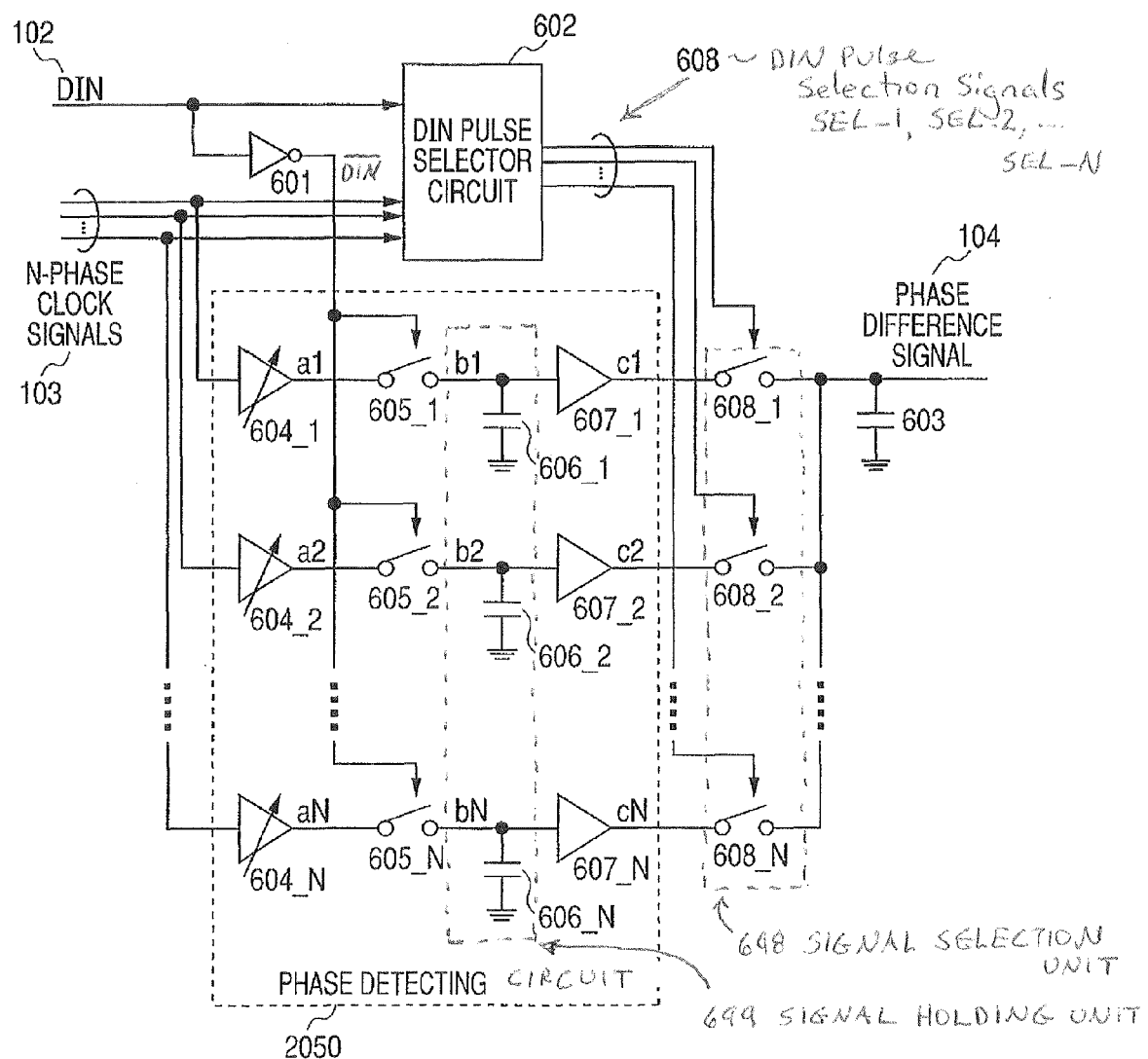
FIG. 6 is a block diagram of an example configuration of a phase detector circuit for a clock and data recovery circuit according to a second embodiment of the invention.

FIG. 6 is a block diagram of an example configuration of a phase detector circuit for a clock and data recovery circuit according to a second embodiment of the present invention. The phase detector circuit shown in FIG. 6 includes a phase detecting section 2050 which has as many as N variable slew-rate driver circuits 604_1 to 604_N (wherein N represents an integer of 2 or larger), N tracking control switches 605_1 to 605_N, N tracked voltage holding capacitors 606_1 to 606_N in signal holding unit 699, and N fixed-gain amplifiers 607_1 to 607_N, a logic inversion circuit 601, a DIN pulse selector circuit 602 for outputting DIN pulse selection signals 608 (SEL_1 to SEL_N), which are DIN pulse identification signals, a phase difference signal voltage holding capacitor 603, and holding control switches 608_1 to 608_N used in signal selection unit 698. The phase detector circuit configured as described above is compatible with a 1/N rate architecture, and the holding control switches, which are fundamental constituent elements of the track-and-hold circuit, also have a signal selection function. It is therefore possible to make the circuit size smaller and promote power saving while maintaining the accuracy of phase difference output signals.

The variable slew-rate driver circuits 604_1 to 604_N cause the N-phase clock signals CLK_1 to CLK_N to be outputted with a prescribed rising time which is typically set to be equal to a symbol time.

The tracking control switches 605_1 to 605_N conduct when the DIN is low, thereby shorting the outputs of the variable slew-rate driver circuits 604_1 to 604_N to the tracked voltage holding capacitors 606_1 to 606_N. Hence, when the DIN is high, the output voltages of the variable slew-rate driver circuits 604_1 to 604_N sampled when the DIN has risen from low to high are held at the tracked voltage holding capacitors 606_1 to 606_N.

The DIN pulse selector circuit 602 selects a high pulse of the DIN and outputs it to one out of as many as N DIN pulse selection signals (SEL_1 to SEL_N) 608. Namely, the DIN pulse selector circuit 602 determines one out of the N-phase clock signals 103 (CLK_1 to CLK_N) whose phase is closest to 0 or an even-number multiple of $\pi$ relative to a rising edge of the DIN, and outputs the high pulse of the DIN to the DIN pulse selection signal corresponding to the determined clock signal.

Each of the holding control switches 608_1 to 608_N conducts during the time when the corresponding one of the DIN pulse selection signals (SEL_1 to SEL_N) 608 is high, thereby shorting the output of the corresponding one of the fixed-gain amplifiers 607_1 to 607_N connected to the tracked voltage holding capacitors 606_1 to 606_N to the phase difference signal voltage holding capacitor 603.

Figure 7:
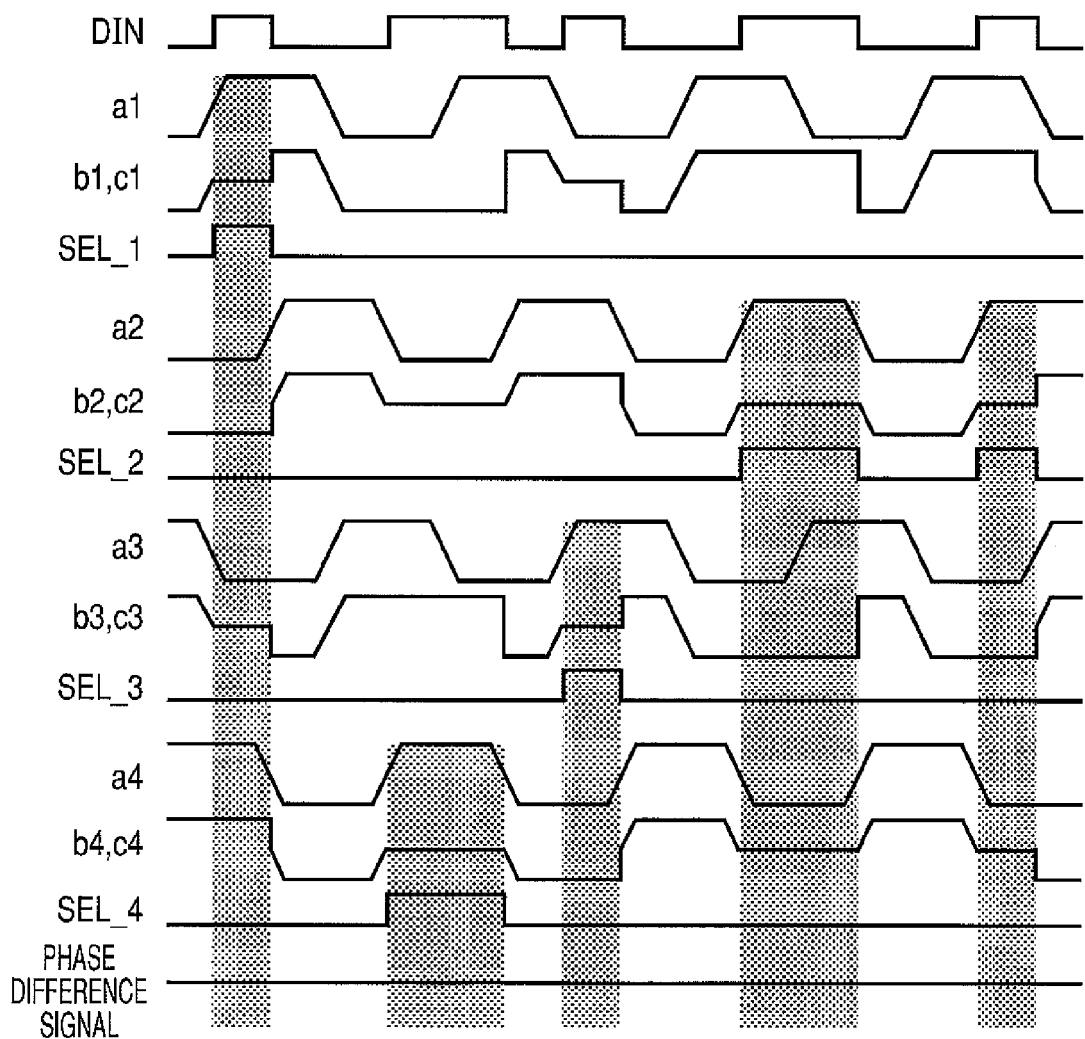
FIG. 7 is a timing chart of operation of the phase detector circuit for a clock and data recovery circuit according to the second embodiment of the invention.

The operation of the phase detector circuit of the second embodiment will be described below with reference to drawings. FIG. 7 is a timing chart of operation of the phase detector circuit of the second embodiment. In this case, the number of phases is assumed to be 4, i.e. N=4.

The input data signal DIN is ordered LHLLHHLHLL-HHLLHL in NRZ format. Outputs a1 to a4 of the variable slew-rate driver circuits are four-phase clock signals each with a period equaling four times the symbol time of the DIN and a rising time equaling the symbol time.

While the DIN is low, the tracking control switches remain conducting and voltages b1 to b4 across the tracked voltage holding capacitors equal the voltages of outputs a1 to a4, respectively. When the DIN rises from low to high, the tracking control switches are cut off causing the voltages a1 to a4 captured at the instant when the DIN rose from low to high to be held by the tracked voltage holding capacitors.

The outputs of the fixed-gain amplifiers equal the voltages held by the tracked voltage holding capacitors multiplied by a fixed factor. The timing chart shown in FIG. 7 assumes that the fixed factor is 1, that is, the outputs of the fixed-gain amplifiers equal the voltages held by the corresponding tracked voltage holding capacitors, respectively.

When the DIN rises from low to high, the DIN pulse selector circuit 602 determines which one of the four-phase clock signals a1 to a4 is closest, in phase relative to the rising edge of the DIN, to 0 or an even-number multiple of $\pi$, and outputs the high pulse of the DIN only to the one among the DIN pulse control signals SEL_1 to SEL_4 corresponding to the clock signal thus determined.

In the example shown in FIG. 7, the first high pulse of the DIN rises in synchronization with a rising edge of the clock signal a1, so that it is outputted to the SEL_1 signal. The second high pulse of the DIN rises in synchronization with a rising edge of the clock signal a4, so that it is outputted to the SEL_4 signal. Similarly, the third high pulse of the DIN is outputted to the SEL_3 signal, and the fourth and fifth high pulses of the DIN are outputted to the SEL_2 signal.

The DIN pulse identification signals SEL_1 to SEL_4 control the corresponding holding control switches, respectively. During the first high pulse period of the DIN, therefore, the output c1 of the fixed-gain amplifier 607_1 and the phase difference signal voltage holding capacitor 603 are short-circuited causing the c1 to be outputted as a phase difference signal. Similarly, c4 and c3 are short-circuited with the phase difference signal voltage holding capacitor 603 during the second and third high pulse periods of the DIN, respectively, to be outputted as a phase difference signal. During the fourth and fifth high pulse periods of the DIN, c2 is short-circuited with the phase difference signal voltage holding capacitor 603 to be outputted as a phase difference signal.

During the time when the DIN is low, all the holding control switches remain cut off, so that the voltage held by the phase difference signal voltage holding capacitor 603 is outputted as a phase difference signal. Namely, during the time when the DIN is low, the phase difference signal outputted in the immediately preceding high pulse period of the DIN is retained.

As described above, when the DIN rises from low to high, the clock signal whose phase relative to the rising edge of the DIN is determined to be closest to 0 or an even-number multiple of $\pi$ is sampled and held to be outputted as a phase difference signal. Thus, phase comparison can be correctly performed in a 1/N rate architecture.

In reality, there are many cases in which, as described in the foregoing, a phase difference signal 104 is generated by averaging plural signals using a low-pass filter in a CDR circuit. In such cases, an alternative configuration may be used which does not include the fixed-gain amplifiers 607_1 to 607_N and in which the tracking control switches 605_1 to 605_N and the holding control switches 608_1 to 608_N are directly connected. In this case, phase differences between the DIN and clock signals at rising edges of the DIN are averaged by charge redistribution between the tracked voltage holding capacitors 606_1 to 606_N and the phase difference signal voltage holding capacitor 603, and the average voltage is outputted as the phase difference signal 104.

In the phase detector circuit, the conversion gain in converting a phase difference to an output voltage can be adjusted by adjusting the rising time of the output voltage of each of the variable slew-rate driver circuits 604_1 to 604_N or the full amplitude of the output voltage. It is also possible to adjust the relationship between the phase difference and the output voltage of the phase detector circuit into a desired linear or non-linear characteristic by adjusting the manner in which the output voltage of each of the variable slew-rate driver circuits rises (the output voltage transient waveform).

Figure 8:
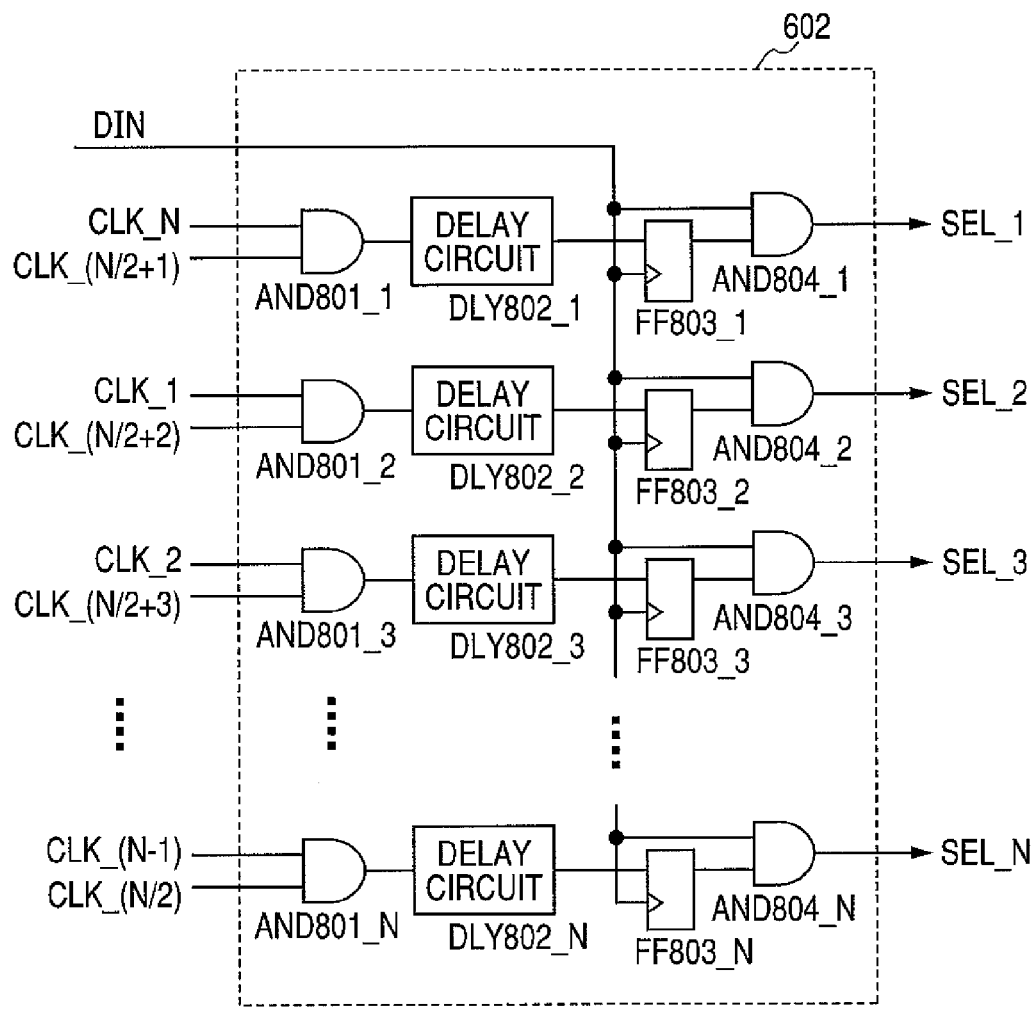
FIG. 8 is a block diagram of an example configuration of the DIN pulse selector circuit shown in FIG. 6.

FIG. 8 is a block diagram of an example configuration of the DIN pulse selector circuit 602. The N-phase clock signals CLK_1 to CLK_N shown in FIG. 8 are clock signals with a duty ratio of 50% whose phases are shifted in $2\pi/N$ steps, N representing an even number. Using as many as N AND circuits AND801_1 to AND801_N, as many logical products of clock signals are obtained, each logical product being of one of the N-phase clock signals and the (N/2−1)th clock signal counted from the one. The logical products thus obtained are delayed using as many delay circuits and are then latched by as many flip-flops FF803_1 to FF803_N each synchronized with a rising edge of the DIN. AND circuits 804_1 to 804_N then obtain the logical products of the DIN and the above logical products latched by the flip-flops FF803_1 to FF803_N, and output the resultant logical products as DIN pulse identification signals SEL_1 to SEL_N. The delay time of each of delay circuits DLY802_1 to DLY802_N is adjusted typically to be a half symbol time. The DIN pulse selector circuit 602 shown in FIG. 8 has a configuration equivalent to the configuration of the identification signal generation circuit 106 shown in FIG. 3 added to, in its rear stage, by the AND circuits for obtaining the logical products of the identification signal outputs and the DIN. Therefore, whereas all the DIN pulse identification signals SEL_1 to SEL_N are low during the time when the DIN is low; when the DIN rises from low to high, out of the DIN pulse identification signals SEL_1 to SEL_N, only the one corresponding to the clock signal among the N-phase clock signals 103 (CLK_1 to CLK_N) whose phase relative to the rising edge of the DIN is closest to 0 or an even-number multiple of $\pi$ becomes high with the other ones of the DIN pulse identification signals SEL_1 to SEL_N left low.

Another circuit configuration may also be used which includes, instead of the flip-flops FF803_1 to FF803_N, level sensing latches to operate in through mode when the DIN is low and in hold mode when the DIN is high. Such a circuit configuration including level sensing latches can be made simpler than circuit configurations including flip-flops and, in addition, the delay of the DIN pulse identification signals SEL_1 to SEL_N relative to the DIN is reduced. This makes timing adjustment easier between the tracking control switches 605_1 to 605_N and the holding control switches 608_1 to 608_N.

Instead of the configuration shown in FIG. 8 in which the N-phase clock signals CLK_1 to CLK_N are inputted to the DIN pulse selector circuit 602 and the inputted clock signals are delayed by a half symbol time by the delay circuits DLY302_1 to DLY302_N, a different configuration may be used in which N-phase clock signals shifted in phase by $\pi/N$ (shifted in time by a half symbol time) from the N-phase clock signals CLK_1 to CLK_N, respectively, are inputted to the DIN pulse selector circuit 602. Such a configuration is advantageous in that the operation is not affected by variations in the delays effected by the delay circuits. Such N-phase clock signals shifted in phase by $\pi/N$ (shifted in time by a half symbol time) from the N-phase clock signals CLK_1 to CLK_N, respectively, can be generated using a known method, for example, by frequency-dividing double-frequency clock signals or by interpolating intermediate phase clock signals between the N-phase clock signals CLK_1 to CLK_N using a phase interpolation circuit.

When the delay times of the delay circuits DLY802_1 to DLY802_N vary, the maximum phase difference between the DIN and a clock signal that can be outputted unlimitedly by the phase difference comparator circuit becomes smaller. When the variation of delay times of the delay circuits DLY802_1 to DLY802_N is not so large as to cause the output value of phase difference between the DIN and a clock signal to be limited, the accuracy of conversion of a phase difference into a phase difference output signal is not affected. Therefore, in cases where the estimated maximum phase difference between the DIN and clock signals is not so large, a considerable degree of variation is tolerated for the delay times of the delay circuits DLY802_1 to DLY802_N.

Figure 9:
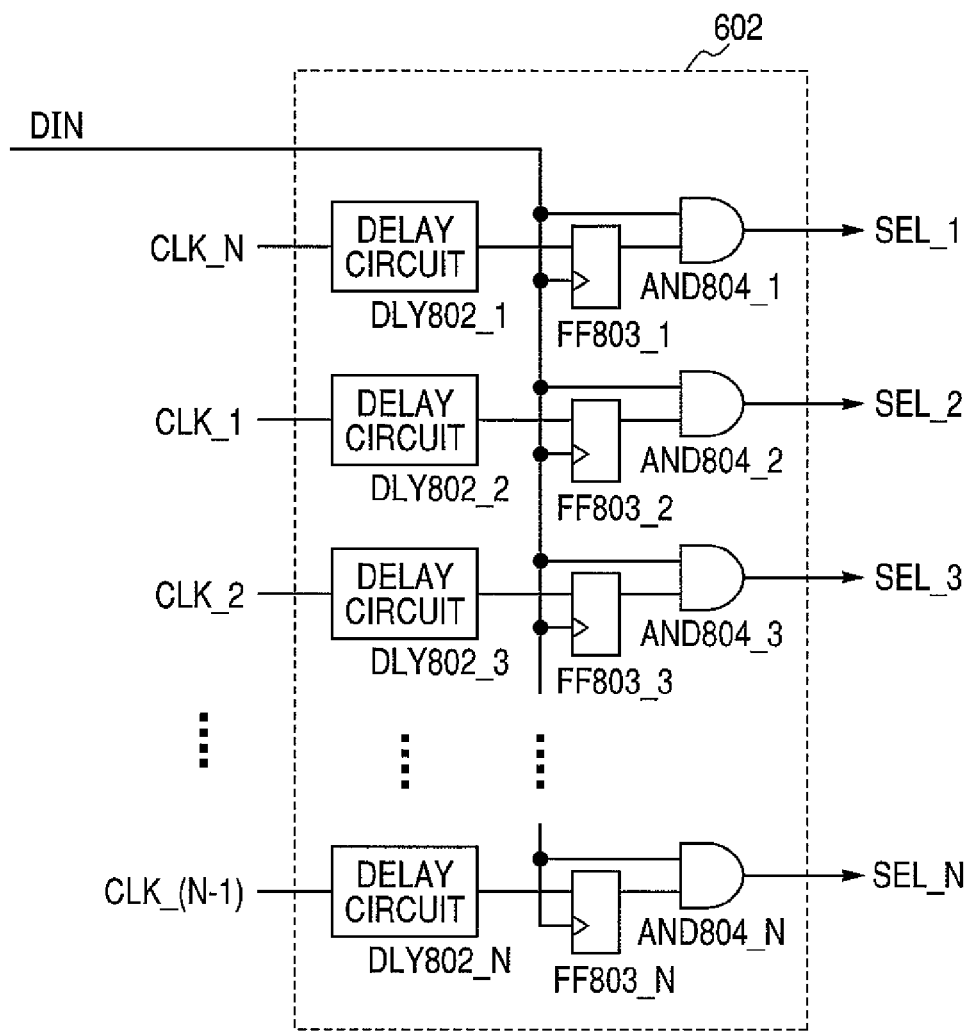
FIG. 9 is a block diagram of another example configuration of the DIN pulse selector circuit shown in FIG. 6.

FIG. 9 is a block diagram of an example of the different configuration mentioned above of the DIN pulse selector circuit 602. The N-phase clock signals CLK_1 to CLK_N are delayed by as many corresponding delay circuits, and are then latched by as many flip-flops FF303_1 to FF303_N each synchronized with a rising edge of the DIN. The AND circuits 804_1 to 804_N then obtain the logical products of the DIN and the latched clock signals so as to generate as many as N identification signals. Referring to FIG. 9, the N-phase clock signals CLK_1 to CLK_N are asymmetric clock signals with phases shifted in $2\pi/N$ steps and each with a high period equaling a symbol time and a low period equaling (N−1) times the symbol time. Referring to FIG. 6, the tracked voltage holding capacitors 606_1 to 606_N only hold the voltages of the N-phase clock signals CLK_1 to CLK_N sampled at a rising edge of the input data signal DIN, so that they can properly operate even in cases where the N-phase clock signals CLK_1 to CLK_N are asymmetric clock signals with phases shifted in $2\pi/N$ steps and each with a high period equaling a symbol time and a low period equaling (N−1) times the symbol time. In this case, the DIN pulse selector circuit 602 requires no AND circuit, so that its configuration can be simplified and so that the number represented by "N" of phases of the clock signals can be odd.

The DIN pulse selector circuit 602 shown in FIG. 9 has a configuration equivalent to the configuration of the identification signal generation circuit 106 shown in FIG. 4 added to, in its rear stage, by the AND circuits for obtaining the logical products of identification signal outputs and the DIN. Therefore, whereas all the DIN pulse identification signals SEL_1 to SEL_N are low during the time when the DIN is low; when the DIN rises from low to high, out of the DIN pulse identification signals SEL_1 to SEL_N, only the one corresponding to the clock signal among the N-phase clock signals 103 (CLK_1 to CLK_N) whose phase relative to the rising edge of the DIN is closest to 0 or an even-number multiple of $\pi$ becomes high with the other ones of the DIN pulse identification signals SEL_1 to SEL_N left low.

The variation of the configuration described with reference to FIG. 8 can also be applied to the DIN pulse selector circuit 602 shown in FIG. 9.

As described above, the phase detector circuit of the second embodiment makes it possible, in a 1/N rate architecture in which N-phase clock signals with a period equaling N times a symbol time are used, to accurately output the phase difference between the data signal DIN and a clock signal using a simple circuit.

Third Embodiment

Figure 14:
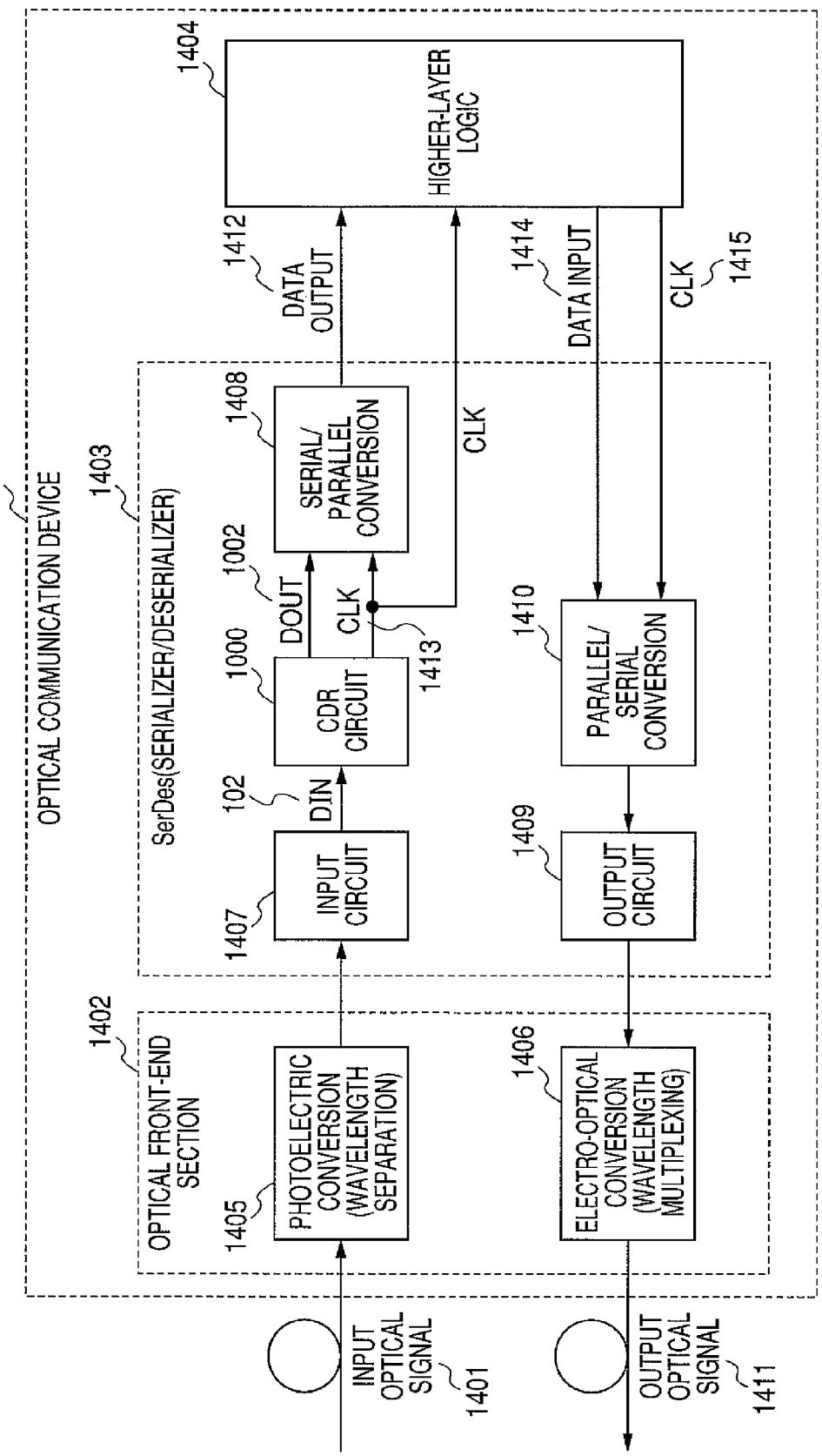
FIG. 14 is a block diagram of an example configuration of an optical communication device 1400 according to a third embodiment of the invention, the device including a phase detector circuit according to the first or the second embodiment of the invention and complying with, for example, GPON, 10 GPON, or 100 G Ethernet (IEEE 802.3ba).

FIG. 14 is a block diagram of an example configuration of an optical communication device 1400 according to a third embodiment of the present invention. The device complies with, for example, GPON, 10 GPON, or 100 G Ethernet (IEEE 802.3ba) and includes a phase detector circuit according to the first or the second embodiment of the present invention.

The optical communication device 1404 shown in FIG. 14 includes a digital logic circuit (higher-layer logic 1404) of layer 2 or higher, for example, a media access control (MAC) layer, a serializer/deserializer 1403 which performs conversion between a relatively low-speed, higher-layer digital signal and a high-speed serial signal (analog waveform), and an optical front-end section 1402 which performs conversion between an electrical signal inputted/outputted by the serializer/deserializer 1403 and an optical signal transmitted over an optical fiber.

Figure 10:
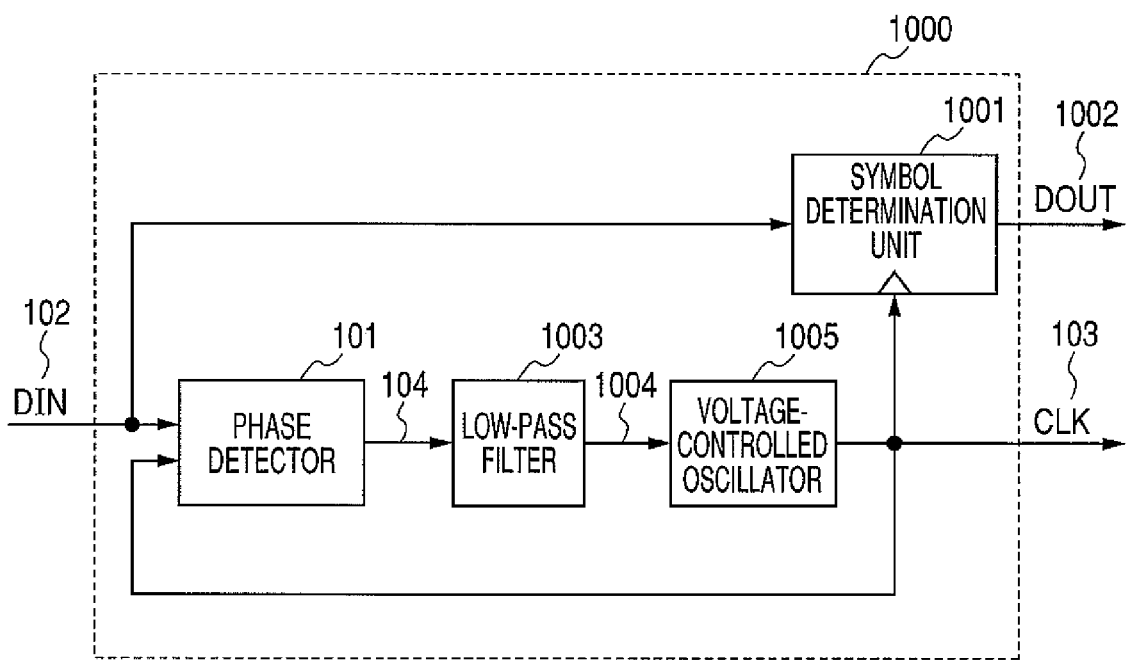
FIG. 10 is a block diagram of an example configuration of the clock and data recovery circuit disclosed in the foregoing reference literature.
Figure 11A:
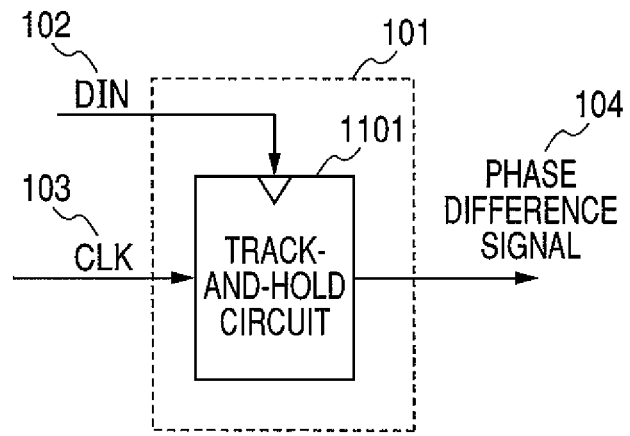
FIG. 11A is a detailed block diagram of an example configuration of the phase detector circuit shown in FIG. 10.
Figure 11B:
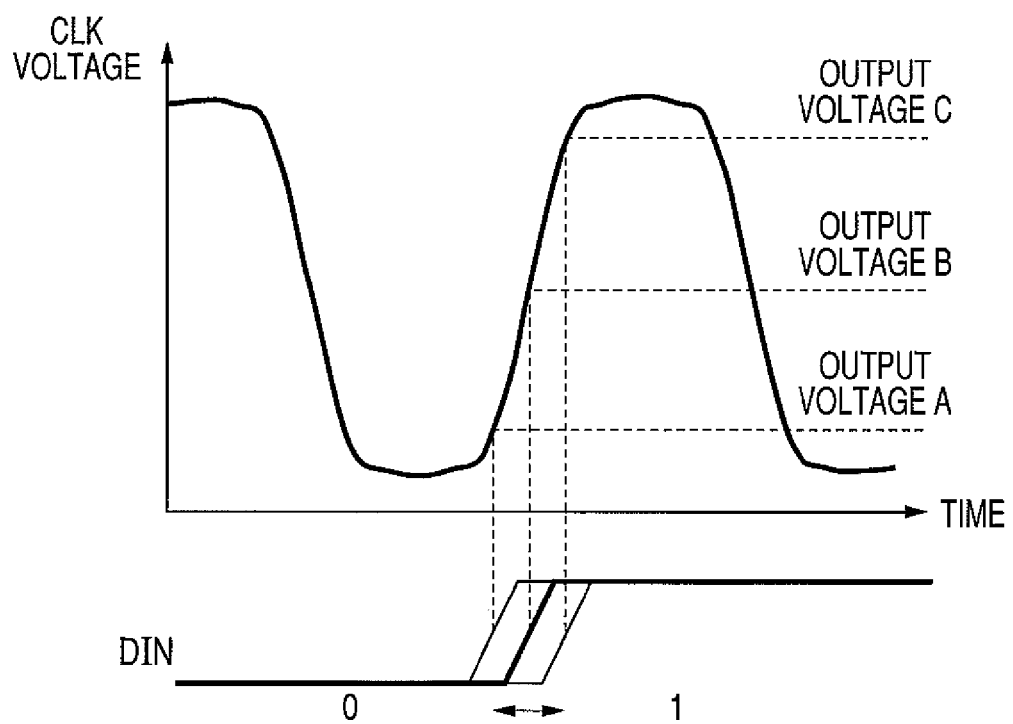
FIG. 11B is a timing chart of operation of the phase detector circuit.
Figure 12:
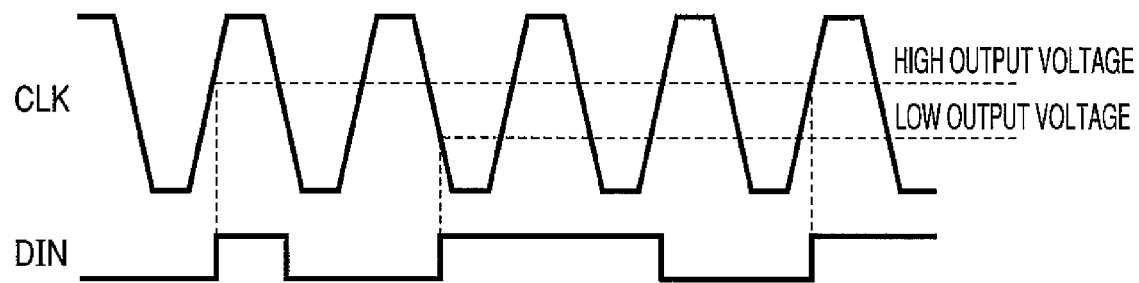
FIG. 12 is a timing chart illustrating a problem with the phase detector circuit shown in FIGS. 11A and 11B.
Figure 13:
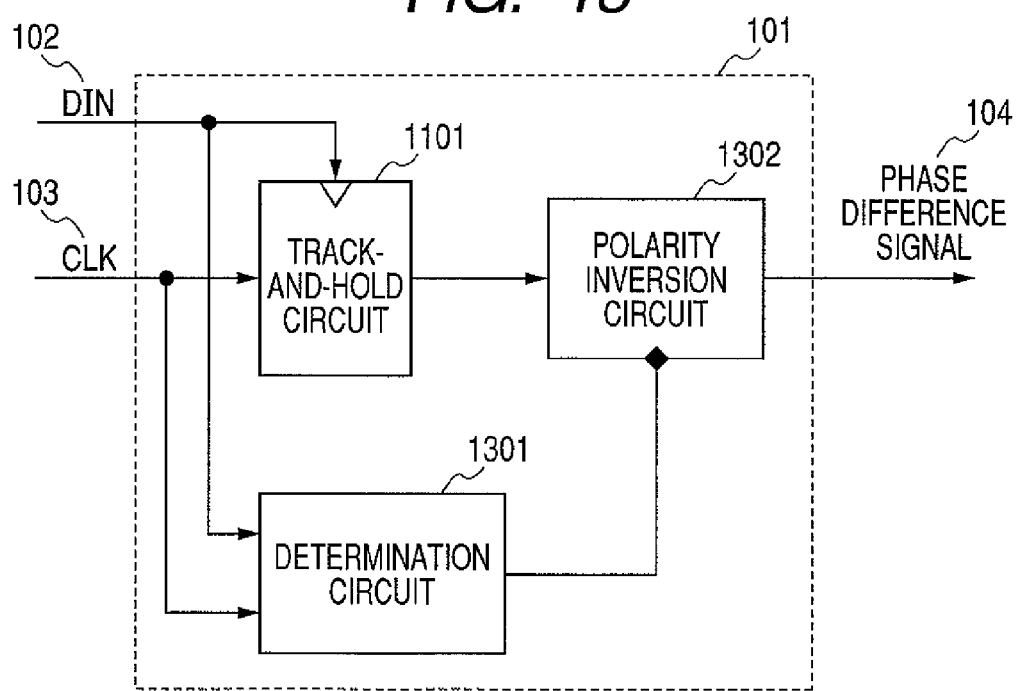
FIG. 13 is a block diagram of an example configuration of the phase detector circuit disclosed in JP-A No. 2007-267005.

An optical signal 1401 inputted from an optical fiber to the optical communication device 1400 is converted into an electrical signal by a photoelectric conversion circuit 1405. There are cases in which an optical signal includes plural wavelength-multiplexed signals. In such cases, wavelength separation is also performed in the photoelectric conversion circuit 1405. An input circuit 1407 included in the serializer/deserializer 1403 amplifies an electrical signal inputted from the photoelectric conversion circuit 1405 to generate an amplified analog signal DIN102. The amplified signal DIN102 is inputted to the CDR circuit 1000, described in the foregoing with reference to FIG. 10, to have digital data DOUT (1002) and a recovered clock signal CLK1413 outputted from the CDR circuit 1000. The digital data DOUT (1002) is converted into low-speed parallel data by a serial/parallel conversion circuit 1408 and outputted (1412) to the higher-layer logic 1404. At this time, the recovered clock signal CLK1413 (timing information) generated by the CDR circuit 1000 is also inputted to the higher-layer logic 1404. The higher-layer logic 1404 logically processes the data received (1412) from the serial/parallel conversion circuit 1408 and inputs low-speed digital data (1414) together with an accompanying clock signal (1415) to a parallel/serial conversion circuit 1410 included in the serializer/deserializer 1403. The low-speed digital data is converted into a high-speed serial signal by the parallel/serial conversion circuit 1410, then outputted by an output circuit 1409 as an analog waveform to the optical front end 1402. At this time, wavelength multiplexing may be performed as required.

The optical communication device of the third embodiment provided with a phase detector circuit according to the first or the second embodiment includes a serializer/deserializer circuit which includes a CDR circuit and which performs conversion between a relatively low-speed, higher-layer digital signal and a high-speed serial signal (analog waveform). The CDR circuit uses a 1/N rate architecture, in which N-phase clock signals with a period equaling N times a symbol time are used, and requires no circuit block for processing analog voltage as it is as analog data, for example, for polarity inversion. This makes it possible to reduce the production cost of the optical communication device while also reducing the power consumption of the device.

The phase detector circuit for a clock and data recovery circuit according to the third embodiment can be widely used as a phase detector circuit on a receiving side of an embedded clock transmission system for recovering a clock signal embedded in a data signal. It can be used particularly advantageously in a high-speed serial transmission system with a transmission rate of 10 Gbps or more or a high-speed optical transmission system using, in many cases, a 1/N rate architecture in which the clock rate in the receiving circuit is set to be equal to 1/N times a symbol rate to meet a request to process a high-speed signal with small power consumption.

What is claimed is:

1. A phase detector circuit for outputting a phase difference between an input signal and a plurality of clock signals, the plurality of clock signals being N in number, N being an integer of 2 or larger, the clock signals each having a period equaling N times a period of the input signal, and having phases shifted in steps of 1/N times the period, the phase detector circuit comprising:
   a phase detecting circuit configured to output phase difference signals representing phase differences between the N clock signals in respect to a rising edge of either one of the input signal and an inversion of the input signal;
   an identification signal output unit configured to output an identification signal identifying either a first clock signal or a second clock signal, the first clock signal being one among the N clock signals whose phase, relative to a rising edge of the input signal, is closest to 0 or an even number multiple of π, and the second clock signal being one among the N clock signals whose phase, relative to a rising edge of the input signal, is closest to an odd number multiple of π; and
   a signal selection unit configured to select, out of the phase difference signals outputted by the phase detecting circuit, a phase difference signal representing the phase difference between; the rising edge of the respective one of the input signal and the inversion of the input signal, and the respective one of the first clock signal and the second clock signal, according to the identification signal.

2. The phase detector circuit according to claim 1, wherein the phase detecting circuit includes: an input section for each of the N clock signals, and an output section for each of the phase difference signals.

3. The phase detector circuit according to claim 1, wherein the phase detecting circuit outputs the phase difference signals according to amplitudes of the N clock signals, taken when an edge of the respective one of the input signal and the inversion of the input signal is formed.

4. The phase detector circuit according to claim 2, wherein the signal selection unit includes:
   a first switching unit for each of the phase difference signals, the first switching unit conducting the each of the phase difference signals according to the identification signal.

5. The phase detector circuit according to claim 1, wherein the identification signal output unit outputs the identification signal according to a logic value of one of the N clock signals and the input signal.

6. The phase detector circuit according to claim 5, wherein the identification signal output unit outputs the identification signal according to a first logical product of the logic value and the input signal.

7. The phase detector circuit according to claim 5, wherein the one of the N clock signals is one of a third clock signal and a fourth clock signal among the N clock signals, the third clock signal being ahead of the first clock signal in phase by 1/N times the period, the fourth clock signal being ahead of the second clock signal in phase by 1/N times the period.

8. The phase detector circuit according to claim 6, wherein the identification signal output unit outputs the identification signal according to a second logical product of two of the N clock signals and the input signal.

9. The phase detector circuit according to claim 8, wherein the identification signal output unit outputs the identification signal according to a third logical product of the second logical product and the input signal.

10. The phase detector circuit according to claim 8, wherein N is an even number, and the two of the N clock signals are either:
- a third clock signal and a fifth clock signal among the N clock signals, the third clock signal being ahead of the first clock signal in phase by 1/N times the period, the fifth clock signal being shifted in phase from the third clock signal by (½−1/N) times the period; or
- a fourth clock signal and a sixth clock signal among the N clock signals, the fourth clock signal being ahead of the second clock signal in phase by 1/N times the period, the sixth clock signal being shifted in phase from the fourth clock signal by (½−1/N) times the period.

11. The phase detector circuit according to claim 5, wherein the logic value is outputted by one of a flip-flop circuit and a level sensing latch circuit.

12. The phase detector circuit according to claim 4, wherein when the phase detecting circuit is configured to use the inversion of the input signal, the phase detecting circuit includes:
- a first signal holding unit corresponding to each of the N clock signals to hold the each of the N clock signals; and
- a second switching unit corresponding to each of the N clock signals, the second switching unit conducting the each of the N clock signals to the corresponding first signal holding unit according to whether the inversion of the input signal is of a predetermined logic value.

13. An optical communication device comprising:
- a first conversion circuit which converts an optical input signal received from an optical network into an electrical signal;
- a second conversion circuit which processes the electrical signal outputted from the first conversion circuit for analog-to-digital conversion to obtain a digital signal; and
- a logic circuit which logically processes the digital signal outputted from the second conversion circuit, wherein the second conversion circuit includes:
- a phase detecting circuit configured to output phase differences between a plurality of clock signals, totaling N in number, in respect to a rising edge of either one of the electrical signal and an inversion of the electrical signal, N being an integer of 2 or larger, the clock signals each having a period equaling N times a period of the respective one of the electrical signal and the inversion of the electrical signal, and having phases shifted in steps of 1/N times the period;
- an identification signal output unit configured to output an identification signal identifying either one of a first clock signal or a second clock signal, the first clock signal being one among the N clock signals whose phase, relative to a rising edge of the electrical signal, is closest to 0 or an even number multiple of π, and the second clock signal being one among the N clock signals whose phase, relative to a rising edge of the electrical signal, is closest to an odd number multiple of π; and
- a signal selection unit configured to select and output, according to the identification signal, a phase difference signal from among the phase difference signals outputted by the phase detecting circuit, representing the phase difference between: the rising edge of the respective one of the electrical signal and the inversion of the electrical signal, and the respective one of the first clock signal and the second clock signal.

14. The optical communication device according to claim 13, wherein the phase detecting circuit includes: an input section for each of the N clock signals, and an output section for each of the phase difference signals.

15. The optical communication device according to claim 13, wherein the phase detecting circuit outputs the phase difference signals according to amplitudes of the N clock signals, taken when an edge of the respective one of the electrical signal and the inversion of the electrical signal is formed.

16. The optical communication device according to claim 14, wherein the signal selection unit includes:
- a first switching unit for each of the phase difference signals, the first switching unit conducting the each of the phase difference signals to the second output section according to the identification signal.

17. The optical communication device according to claim 13, wherein the identification signal output unit outputs the identification signal according to a logic value of one of the N clock signals and the electrical signal.

18. The optical communication device according to claim 13, wherein the identification signal output unit outputs the identification signal according to a second logical product of two of the N clock signals and the electrical signal.

19. The optical communication device according to claim 17, wherein the logic value is outputted by one of a flip-flop circuit and a level sensing latch circuit.

20. The optical communication device according to claim 16, wherein when the phase detecting circuit is configured to use the inversion of the input signal, the phase detecting circuit includes:
- a first signal holding unit corresponding to each of the N clock signals to hold the each of the N clock signals; and
- a second switching unit corresponding to each of the N clock signals, the second switching unit conducting the each of the N clock signals to the corresponding first signal holding unit according to whether the inversion of the electrical signal is of a predetermined logic value.

* * * * *